(12) United States Patent
McGrath et al.

(10) Patent No.: US 6,569,984 B2
(45) Date of Patent: May 27, 2003

(54) METHOD FOR MAKING POLYIMIDE

(75) Inventors: James E. McGrath, Blacksburg, VA (US); Sue J. Mecham, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 09/843,142

(22) Filed: Apr. 27, 2001

(65) Prior Publication Data

US 2002/0022710 A1 Feb. 21, 2002

Related U.S. Application Data

(60) Provisional application No. 60/200,006, filed on Apr. 27, 2000.

(51) Int. Cl.$^7$ .................. C08G 69/26; C08G 69/28; C08G 73/10
(52) U.S. Cl. .................. 528/170; 528/125; 528/126; 528/128; 528/172; 528/173; 528/183; 528/188; 528/220; 528/229; 528/272; 528/350; 528/353
(58) Field of Search .................. 528/125, 126, 528/128, 170, 172, 173, 183, 188, 220, 229, 272, 350, 353

(56) References Cited

U.S. PATENT DOCUMENTS

| | | | | | |
|---|---|---|---|---|---|
| 3,347,808 | A | * | 10/1967 | Lavin et al. | 106/287.24 |
| 4,346,182 | A | * | 8/1982 | Gagliani et al. | 528/353 |
| 4,546,115 | A | * | 10/1985 | Gagliani et al. | 521/77 |
| 4,556,682 | A | * | 12/1985 | Gagliani et al. | 521/185 |
| 4,562,100 | A | * | 12/1985 | Fryd et al. | 427/385.5 |
| 5,298,531 | A | * | 3/1994 | Ishikura et al. | 528/347 |

* cited by examiner

Primary Examiner—P. Hampton-Hightower
(74) Attorney, Agent, or Firm—Whitham, Curtis & Christofferson, PC

(57) ABSTRACT

The invention is directed to method for making a polyimide by converting the dianhydride to the ester acid and reacting the ester acid with a diamine. The invention allows for the controlled addition of aliphatic diamines resulting in control of the polyimide properties such as the glass transition temperature, solubility, and melt processability.

9 Claims, No Drawings

METHOD FOR MAKING POLYIMIDE

This Application claims priority to U.S. provisional application Ser. No. 60/200,006, filed on Apr. 27, 2000, herein incorporated by reference in its entirety.

FIELD OF THE INVENTION

The present invention generally relates to a new method for preparing high molecular weight, easily processed, fully-cyclized polyimides containing controlled amounts of aliphatic groups making polyimides.

BACKGROUND OF THE INVENTION

Polyimides are useful in a variety of applications. Polyimides may be used in flexible printed circuit boards for electronic devices. Other applications include, adhesives, matrix resins for composites, as well as films and coatings.

Typically, polyimides are made by the condensation of a diamine and a dianhydride. This reaction initially results in the formation of a prepolymer, polyamic acid, followed by heating the polyamic acid to form the polyimide. However, the use of aliphatic diamines poses difficulties in generating high molecular weight polyimides because of complexation (salt formation) after reaction with conventional dianhydrides. Typically, salt complexes are formed and gelation of the reaction mixture is often observed. Further, it is difficult to control the amount of aliphatic units in the polyimide when the poly amic acid route is utilized.

SUMMARY OF THE INVENTION

It is an object of the present invention to provide a method for making a polyimide where the polyimide contains a controlled amount of aliphatic units.

Further, it is an object of the present invention to provide a method that reduces the formation of salt-like complexes and gelation that is associated with the polyamic acid route.

The invention also includes the polyimide material made by the process of the present invention.

Accordingly, it has been found that a high molecular weight polyimide that is fully cyclized and contains a controlled amount of aliphatic units can be prepared by converting the dianhydride to an ester acid and reacting the ester acid with a controlled amount of an aliphatic diamine.

The invention includes reacting a diamine with an ester acid of a dianhydride to form a polyimide. A wide range of dianhydrides could be used in this invention. For example, the dianhydride may be pyromellitic dianhydride, bisphenol A dianhydride, or combinations thereof. The diamine may include aliphatic diamines, aromatic diamines, and combinations thereof. For example, the diamine may be dodecyldiamine, oxydianiline, diaminophenylindane, hexamethylene diamine, cyclohexyl diamine, and combinations thereof. Preferably, the ester acid is formed by reacting the dianhydride with an alcohol to form the ester acid.

Still further, the present invention includes a method for making a polyimide comprising the steps of converting a dianhydride to an ester acid and reacting a predetermined amount of an aliphatic diamine with the ester acid. The step of reacting a predetermined amount of an aliphatic diamine with the ester acid may include reacting a predetermined amount of a second diamine with the ester acid. The second diamine is preferably aromatic. In this way, a blend is produced where the resulting polyimide includes controlled amounts of aliphatic and aromatic monomers.

DETAILED DESCRIPTION OF THE INVENTION

High molecular weight processable fully-cyclized polyimides containing controlled amounts of aliphatic units were prepared by the method of the present invention. As illustrated in Scheme I, the method involves the conversion of a dianhydride into an ester acid. The ester acid may then be reacted with a diamine to form the polyimide. In one embodiment, aliphatic diamines may be added directly in any desired proportion for reaction with the ester acid to form a polyimide. In this way, the amount of aliphatic units may be controlled and the reaction proceeds without gelation. Normally, the direct reaction of an aliphatic diamine with a dianhydride produces a salt-like complex that results in low molecular weight polymers and often leads to partial gelation.

Scheme 1
Polyimides formed from the ester-acid solution imidization route

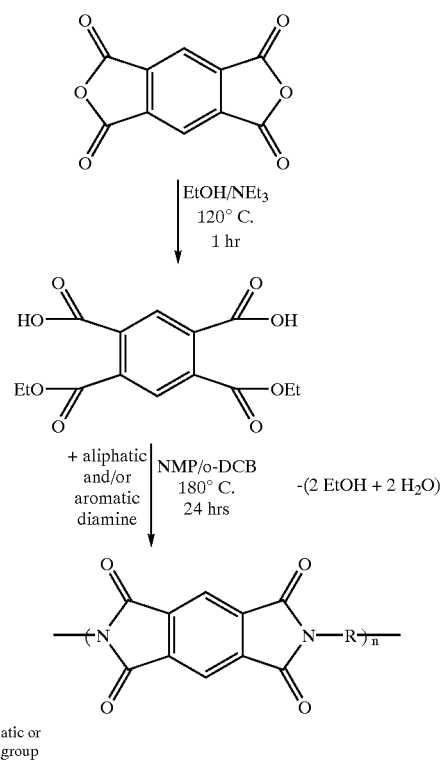

R = aliphatic or aromatic group

Any dianhydride that is suitable for the preparation of polyimides may be used with the method of the present invention. Examples of dianhydrides that may be used, include, but are not limited to, pyromellitic dianhydride (PMDA), bisphenol A dianhydride (BPADA), and combinations of dianhydrides.

The dianhydride is converted to an ester acid. An alcohol, such as ethanol, is added to the dianhydride to form the ester acid. The reaction is preferably carried out in the presence of a basic solvent, such as triethylamine. Any solvent that will not hinder the formation of the ester acid may be used. The reaction solution may be heated to facilitate the formation of the ester acid. Preferably, the reaction solution is heated to about 120° C.

After the formation of the ester acid, the ester acid is reacted with the diamine. The diamine or a combination of diamines may be added in specific proportions. The reaction of the ester acid and the diamine is preferably carried out in a relatively benign solvent such as n-methylpyrolidone (NMP) and/or o-DCB. The reaction is preferably heated to about 180° C. to facilitate the formation of the polyimide.

The selection of the diamine depends on the desired properties of the resulting polyimide. Aliphatic diamines or aromatic diamines may be added alone or in combination with one another. The aliphatic diamines may include straight chained or branched hydrocarbon backbones. Preferably the aliphatic diamines have carbon containing backbones that range from about 6 to about 20 carbons. Examples of diamines that may be used with the present invention, include but are not limited to, dodecyldiamine (DoDDa), oxydianiline (ODA) and diaminophenylindane (DAPI), hexamethylene diamine, and cyclohexyl diamine.

The glass transition temperature of the resulting polyimide may be controlled by the relative proportions of aliphatic diamine to aromatic diamine. As the percentage of aliphatic diamine increases relative to the aromatic diamine, the glass transition temperature for the polyimide decreases. By varying the specific aliphatic diamine and the aromatic diamine as well as their relative proportions, properties of the resulting polyimide, such as the glass transition temperature, may be controlled.

High molecular weight amorphous fully cyclized partially aliphatic copolyimides were synthesized via the above-described ester-acid solution imidization route and characterized by gel permeation chromatography (GPC), differential scanning calorimetry (DSC) and thermogravimetric analysis (TGA). The glass transition temperatures were found to decrease systematically with increasing aliphatic diamine mole fraction. These materials also formed tough, creasable thin hydrophobic films when cast from polar aprotic solvents such as NMP and DMAc. The solution spin-cast copolyimides showed good adhesion to glass slides and tantalum coated silicon wafers.

Fully cyclized polyimides, i.e., without amide acid linkages characteristic of poly(amic acid)s, are known to be much more hydrolytically stable and in many cases have lower viscosities than the corresponding poly(amic acid)s. Aliphatic methylene sequences within the polymer backbone are amenable to photo-initiated crosslinking for imaging and allowing control of the glass transition temperature. Synthesis of these materials can be defined to allow for thermoplastic or thermosetting adhesives.

The molecular weight and thermal characterization of some polyimide materials prepared in accordance with the present invention are provided in Tables I and II. Each of these polyimides was amorphous and completely soluble.

TABLE I

Molecular weight and thermal analysis of BPADA base polyamides

| Diamine (mol %) | | | | | 5% wt. Loss |
|---|---|---|---|---|---|
| DoDDa | ODA | Mn* | Mw/Mn | Tg** | in air*** |
| 0 | 100 | 54,000 | 2.9 | 224 | 514 |
| 25 | 75 | 48,300 | 2.2 | 186 | 475 |
| 50 | 50 | 33,600 | 2.3 | 140 | 461 |
| 75 | 25 | 29,600 | 2.0 | 112 | 432 |
| 100 | 0 | 28,500 | 2.2 | 82 | 430 |

*GPC mobile phase: NMP + 0.02 M $P_2O_5$, 60° C.
**DSC $2^{nd}$ heat, scan rate: 10° C. per minute
***TGA scan rate: 10° C. per minute

TABLE II

Molecular weight and thermal analysis of PMDA base polyamides

| Diamine (mol %) | | | | | 5% wt. Loss |
|---|---|---|---|---|---|
| DoDDa | DAPI | Mn* | Mw/Mn | Tg** | in air*** |
| 0 | 100 | 26,100 | 1.7 | 354 | 540 |
| 10 | 90 | 16,600 | 1.9 | 278 | 425 |
| 25 | 75 | 24,100 | 3.8 | 155 | 382 |

*GPC mobile phase: NMP + 0.02 M $P_2O_5$, 60° C.
**DSC $2^{nd}$ heat, scan rate: 10° C. per minute
***TGA scan rate: 10° C. per minute High molecular weight polyimides may be formed in accordance with the present invention. Molecular weight of at least about 15,000 may be obtained. Further, some polyimide materials of the present invention may have molecular weights of at least about 40,000. High molecular weight polyimide systems were formed in all cases with a polydispersity of two, which is expected from theory for step polycondensation polymers. The glass transition temperature, Tg, values decreased with increasing mole percent of dodecyldiamine. The decrease in Tg value arises from the more flexible carbon—carbon bonds present in dodecyldiamine compared to those found in aromatic diamines. This would permit moulding and adhesive bonding under exceptionally mild conditions. An additional advantage of the present invention is that the reaction system for forming the polyimide is less sensitive to moisture than the polyamic acid route.

The materials were also spin cast on 1"×1" glass slides and tantalum coated silicon wafers. The polyimides adhered well to both substrates as determined by a manual peel test.

While the invention has been described in terms of its preferred embodiments, those skilled in the art will recognize that the invention can be practiced with modification within the spirit and scope of the appended claims.

What is claimed is:

1. A method for making a polyimide comprising the steps of:
   converting a dianhydride to an ester acid; and
   reacting a predetermined amount of an aliphatic diamine and a predetermined amount of an aromatic diamine with the ester acid to form a fully cyclized polyimide having a molecular weight of at least 15,000.

2. The method of claim 1 wherein the predetermined amount of said aliphatic diamine is more than the predetermined amount of said aromatic diamine on a mole percentage basis.

3. The method of claim 1 wherein the predetermined amount of said aliphatic diamine is less than the predetermined amount of said aromatic diamine on a mole percentage basis.

4. The method of claim 1 wherein said predetermined amount of said aliphatic diamine has a mole percentage basis ranging from 25% to 75% and said predetermined amount of said aromatic diamine has a mole percentage basis ranging from 75% to 25%.

5. The method of claim 1 wherein said dianyhdride is selected from the group consisting of pyromellitic dianhydride, bisphenol A dianhydride, and combinations thereof.

6. The method of claim 1 wherein said aliphatic diamine is selected from the group consisting of dodecyldiamine, cyclohexyl diamine, and hexamethylene diamine, and combinations thereof.

7. The method of claim 1 wherein said aromatic diamine is selected from the group consisting of oxydianiline, diaminophenylindane, and combinations thereof.

8. The method of claim 1 wherein said reacting step forms a fully cyclized polyimide which has a molecular weight of at least 40,000.

9. The method of claim 1 further comprising the step of adjusting a ratio of said predetermined amount of said aliphatic diamine and said predetermined amount of said aromatic diamine to achieve a higher or lower glass transition temperature in said fully cyclized polyimide.

* * * * *